(12) United States Patent
Natori

(10) Patent No.: US 8,710,418 B2
(45) Date of Patent: Apr. 29, 2014

(54) SOLID-STATE IMAGE CAPTURE DEVICE AND IMAGE CAPTURE APPARATUS

(75) Inventor: Taichi Natori, Kanagawa (JP)

(73) Assignee: Sony Corporation (JP)

( * ) Notice: Subject to any disclaimer, the term of this patent is extended or adjusted under 35 U.S.C. 154(b) by 591 days.

(21) Appl. No.: 12/621,157

(22) Filed: Nov. 18, 2009

(65) Prior Publication Data

US 2010/0123070 A1 May 20, 2010

(30) Foreign Application Priority Data

Nov. 20, 2008 (JP) ................................. 2008-296511

(51) Int. Cl.
*H01L 27/14* (2006.01)
*G01J 3/50* (2006.01)

(52) U.S. Cl.
USPC ...................... 250/208.1; 250/226; 250/338.4; 250/339.05; 348/164; 348/273; 257/40; 257/440; 257/443

(58) Field of Classification Search
USPC .................. 250/208.1, 338.1, 338.4, 339.01, 250/339.02, 339.05, 226; 348/164, 166, 348/273, 216.1, 278, 279; 257/431, 432, 257/440, 443, 40
See application file for complete search history.

(56) References Cited

U.S. PATENT DOCUMENTS

| | | | | |
|---|---|---|---|---|
| 7,411,620 B2 * | 8/2008 | Taniguchi et al. | ............ | 348/294 |
| 7,570,292 B2 * | 8/2009 | Hioki | ............... | 348/294 |
| 7,773,223 B2 * | 8/2010 | Ikami | .............. | 356/417 |
| 7,847,362 B2 * | 12/2010 | Ogino et al. | ................... | 257/436 |
| 7,863,605 B2 * | 1/2011 | Hayashi | .......................... | 257/40 |
| 7,920,189 B2 * | 4/2011 | Goto | ............................ | 348/273 |
| 8,169,518 B2 * | 5/2012 | Ota | .................... | 348/294 |
| 2005/0022856 A1 * | 2/2005 | Komatsu et al. | ............. | 136/243 |
| 2007/0120045 A1 * | 5/2007 | Yokoyama | ................ | 250/214 R |
| 2008/0035965 A1 * | 2/2008 | Hayashi et al. | ................ | 257/291 |
| 2008/0225142 A1 * | 9/2008 | Goto | ................ | 348/272 |
| 2008/0240747 A1 * | 10/2008 | Ikami | ................ | 399/32 |
| 2008/0246107 A1 * | 10/2008 | Maehara | ....................... | 257/432 |
| 2008/0246853 A1 * | 10/2008 | Takizawa et al. | ........... | 348/222.1 |
| 2009/0046185 A1 * | 2/2009 | Ota | .................... | 348/294 |
| 2009/0050881 A1 * | 2/2009 | Hayashi | .......................... | 257/40 |
| 2009/0101953 A1 * | 4/2009 | Hayashi et al. | ................ | 257/292 |
| 2010/0123070 A1 * | 5/2010 | Natori | ........................... | 250/226 |
| 2011/0068254 A1 * | 3/2011 | Hayashi | ..................... | 250/208.1 |

FOREIGN PATENT DOCUMENTS

| | | |
|---|---|---|
| JP | 06-169461 | 6/1994 |
| JP | 2000-059798 | 2/2000 |
| JP | 2000-224469 | 8/2000 |
| JP | 2002-142228 | 5/2002 |
| JP | 2004-337718 | 12/2004 |
| JP | 2005-045559 | 2/2005 |
| JP | 2006-190958 | 7/2006 |

\* cited by examiner

*Primary Examiner* — John Lee
(74) *Attorney, Agent, or Firm* — Sheridan Ross P.C.

(57) ABSTRACT

A solid-state image capture device includes photoelectric conversion elements that perform photoelectric conversion on incident light to obtain signal charges, color filter portions provided at light incident sides of the corresponding photoelectric conversion elements, and an organic photoelectric conversion layer provided at light incident sides of the color filter portions. The organic photoelectric conversion layer contains a pigment that is absorptive of near infrared light.

4 Claims, 10 Drawing Sheets

SOLID-STATE IMAGE CAPTURE DEVICE AND IMAGE CAPTURE APPARATUS

BACKGROUND OF THE INVENTION

1. Field of the Invention

The present invention relates to a solid-state image capture device and an image capture apparatus.

2. Description of the Related Art

Typically, solid-state image capture devices have sensitivities to not only light in a visible-wavelength range (about 400 to 700 nm) but also to near infrared light having longer wavelengths. Thus, when the solid-state image capture devices are used for image capturing for cameras, images appear unnatural.

In order to avoid such an inconvenience, typically, a filter for eliminating light having longer wavelengths than visible light (the filter is hereinafter referred to as an "IR cut filter") is disposed adjacent to a camera lens.

A sensitivity characteristic of such a solid-state image capture device is utilized and a bright image is generated in a situation in which the amount of incident light is small through use of near infrared light together with visible light without use of an IR cut filter. Thus, a system for mechanically creating states in the presence and absence of an IR cut filter in accordance with brightness have been proposed (e.g., refer to Japanese Unexamined Patent Application Publication Nos. 2000-59798, 2000-224469, 2004-337718, and 2005-45559).

However, since such a system has a switching mechanism, it is necessary for operating portions to be manufactured with high accuracy. This makes it difficult to miniaturize a camera system and also makes it difficult to reduce the manufacturing cost.

A system for generating an image by using visible-light signals and near-infrared-light signals regardless of whether the amount of incident light is large or small, without use of an IR cut filter, has also been proposed (e.g., refer to Japanese Unexamined Patent Application Publication No. 06-169461). This system, however, exhibits a deterioration of color reproduction.

In addition, a solid-state image capture element having a function for independently outputting visible-light signals and near-infrared-light signals has also been proposed (e.g., refer to Japanese Unexamined Patent Application Publication Nos. 2002-142228 and 2006-190958). The use of the solid-state image capture element can obtain a color image with favorable color reproduction without use of an IR cut filter. Also, use of near-infrared-light signals when the amount of incident light is small, like at night, makes it possible to obtain a brighter image.

The solid-state image capture element disclosed in Japanese Unexamined Patent Application Publication No. 2002-142228 employs a two-dimensionally arranged pixel array having four types of spectral characteristic. The disclosed solid-state image capture element, therefore, involves strictly defining spectra of color filters, arranged on the two-dimensionally arranged pixel array, in order to independently obtain visible-light signals and near-infrared-light signals. The solid-state image capture element also involves performing matrix computation processing, which is difficult to achieve.

In the solid-state image capture elements disclosed in Japanese Unexamined Patent Application Publication Nos. 2002-142228 and 2006-190958, in order to obtain both visible-light signals and near-infrared-light signals, pixels having sensitivity to near infrared light are arranged in addition to pixels having sensitivity to visible light. The arrangement involves a change in a typical color filter arrangement, such as a Bayer arrangement, for the solid-state image capture elements, and the luminance and color resolution of an image become insufficient.

SUMMARY OF THE INVENTION

Since the pixels having sensitivity to near infrared light are arranged in addition to the pixels having sensitivity to visible light, there are problems in that a typical color filter arrangement, such as a Bayer arrangement, for the solid-state image capture elements is changed, and the luminance and color resolution of an image become insufficient.

Accordingly, it is desirable to make it possible to perform image capture under a condition that the amount of incident light is small, by obtaining both visible-light signals and near-infrared-light signals without a deterioration of color reproduction and a reduction in color resolution.

According to one embodiment of the present invention, there is provided a solid-state image capture device (a first solid-state image capture device). The solid-state image capture device includes: photoelectric conversion elements that perform photoelectric conversion on incident light to obtain signal charges; color filter portions provided at light incident sides of the corresponding photoelectric conversion elements; and an organic photoelectric conversion layer provided at light incident sides of the color filter portions, the organic photoelectric conversion layer containing a pigment that is absorptive of near infrared light.

In the first solid-solid image capture device, the organic photoelectric conversion layer performs photoelectric conversion on near infrared light to obtain signal charge corresponding to the near infrared light. Thus, under a condition that the amount of incident light is small, like at night, it is possible to use the signal charge from the organic photoelectric conversion layer in addition to the signal charges from the photoelectric conversion elements, thus enhancing the sensitivity. Under a condition that the amount of incident light is large, like during the daytime, the photoelectric conversion elements obtain, for example, regular red-light, green-light, and blue-light signal charges without changing the typical arrangement of the color filter portions, such as a Bayer arrangement, for the solid-state image capture elements. Alternatively, the photoelectric conversion elements obtain complementary-color-light signal charges.

According to another embodiment of the present invention, there is provided a solid-state image capture device (a second solid-state image capture device). The solid-state image capture device includes: photoelectric conversion elements that perform photoelectric conversion on near infrared light to obtain signal charges; and organic photoelectric conversion layers provided at light incident sides at which incident light enters the photoelectric conversion elements, the photoelectric conversion layers being absorptive of three-primary-color light including red light, green light, and blue light.

In the second solid-solid image capture device, the photoelectric conversion elements perform photoelectric conversion on near infrared light to obtain signal charges corresponding to the near infrared light. Thus, under a condition that the amount of incident light is small, like at night, it is possible to use the signal charges from the photoelectric conversion portions in addition to the signal charges from the organic photoelectric conversion layers, thus enhancing the sensitivity. Under a condition that the amount of incident light is large, like during the daytime, the organic photoelectric conversion layers obtain, for example, regular red-light, green-light, and blue-light signal charges.

According to another embodiment of the present invention, there is provided an image capture apparatus. The image capture apparatus includes: an image-forming optical section that condenses incident light; a solid-state image capture device that receives the light condensed by the image-forming optical section and performs photoelectric conversion on the received light to provide photoelectrically converted signals; and a signal processor that performs processing on the photoelectrically converted signals. Under a condition that the amount of incident light is large, the signal processor performs signal processing on a basis of red-light, green-light, and blue-light signals output from the solid-state image capture device and outputs color image signals, and under a condition that the amount of incident light is small, the signal processor performs signal processing on a mixture of red-light, green-light, blue-light, and near-infrared-light signals output from the solid-state image capture device and outputs grayscale image signals.

The image capture apparatus according to the embodiment of the present invention independently outputs signals for visible light and signals for near infrared light. Furthermore, under a condition that the amount of incident light is large, like during the daytime, the image capture apparatus outputs color image signals resulting from the signal processing based on red-light, green-light, and blue-light signals output from the solid-state image capture device. Thus, the color reproduction and the color resolution do not deteriorate. Under a condition that the amount of incident light is small, like at night, the image capture apparatus outputs grayscale image signals resulting from the signal processing performed on a mixture of signals in wavelengths in red-light, green-light, blue-light, and near-infrared-light ranges, the signals being output from the solid-state image capture device. Consequently, high-sensitivity output signals are output.

The solid-state image capture device according to the embodiments of the present invention can obtain high-sensitivity output signals without using an IR cut filter and without changing the typical arrangement of color filter portions for solid-state image capture elements, thus making it possible to perform image capture under a condition that the amount of incident light is small without a deterioration of color reproduction and a reduction in color resolution under a condition that the amount of incident light is large.

Under a condition that the amount of incident light is small, the image capture apparatus according to the embodiments of the present invention performs signal processing on a mixture of red-light, green-light, blue-light, and near-infrared-light signals output from the solid-state image capture device and outputs a grayscale image signal. This arrangement, therefore, enhances the sensitivity, thereby making it easy to perform photography at night. Under a condition that the amount of incident light is large, it is also possible to perform color-image photography without a deterioration of color reproduction and a reduction in color resolution.

DESCRIPTION OF THE PREFERRED EMBODIMENTS

Best modes (hereinafter referred to as "embodiments") for carrying out the present invention will be described below.

1. First Embodiment (First Example of Basic Configuration of First Solid-State Image Capture Device and Modification of First Solid-State Image Capture Device)

2. Second Embodiment (Example in which Configuration of First Solid-State Image Capture Device is applied to CMOS Image Sensor)

3. Third Embodiment (Second Example of Basic Configuration of Second Solid-State Image Capture Device)

4. Fourth Embodiment (Example in which Configuration of Second Solid-State Image Capture Device is applied to CMOS Image Sensor)

5. Fifth Embodiment (Example of Basic Configuration of Image Capture Apparatus)

1. First Embodiment

First Example of Basic Configuration of First Solid-State Image Capture Device

A first example of a basic configuration of a first solid-state image capture device according to a first embodiment of the present invention will now be described with reference to a schematic cross-sectional view shown in FIG. 1.

Figure 1:
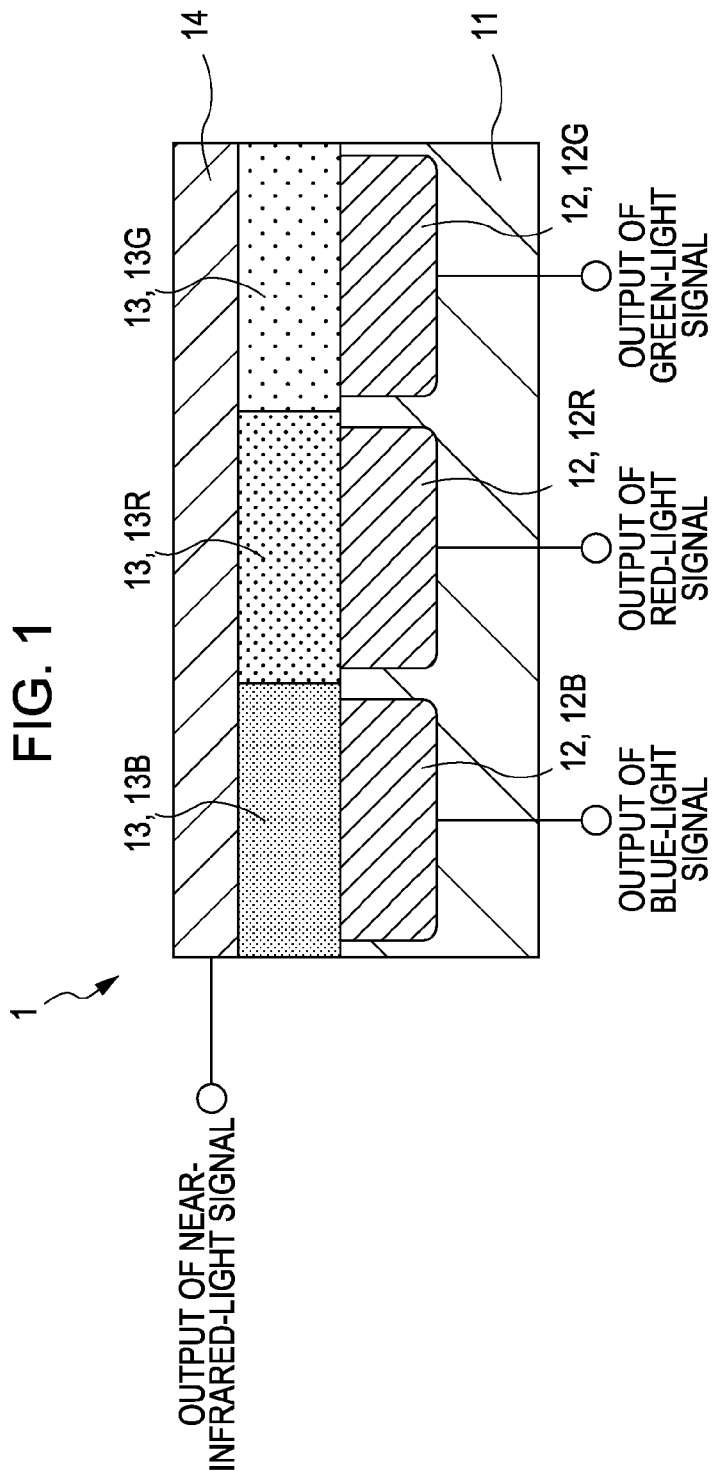
FIG. 1 is a schematic cross-sectional view showing a first example of a basic configuration of a first solid-state image capture device according to a first embodiment of the present invention.

As shown in FIG. 1, a semiconductor substrate 11 has photoelectric conversion elements 12 (12R, 12G, and 12B) that perform photoelectric conversion on incident light to obtain signal charges. Each photoelectric conversion element 12 is implemented by, for example, a photodiode. The semiconductor substrate 11 may be, for example, a silicon substrate. Alternatively, the semiconductor substrate 11 may be a SOI (silicon on insulator) substrate or a substrate obtained by forming a silicon epitaxial growth layer on a silicon layer of a SOI substrate.

Color filter portions 13 are provided at the light incident sides of the photoelectric conversion elements 12.

For example, a color filter portion 13 (a red color-filter portion 13R) for absorbing red light is provided so as to correspond to the photoelectric conversion element 12 (12R). A color filter portion 13 (a green color-filter portion 13G) for absorbing green light is provided so as to correspond to the photoelectric conversion element 12 (12G). Further, a color filter portion 13 (a blue color-filter portion 13B) for absorbing blue light is provided so as to correspond to the photoelectric conversion element 12 (12B).

An organic photoelectric conversion layer 14 containing a pigment that is absorptive of near infrared light is provided at light incident sides of the color filter portions 13. The term "near infrared light" refers to light having a wavelength in the range of, for example, 770 nm to 2.5 µm.

The near-infrared-light absorbing pigment used for the organic photoelectric conversion layer 14 can be used based on a desired spectral characteristic and an output sensitivity characteristic. Examples of the pigment include a quinoid-based metal complex pigment, cyanine-based pigment, immonium-based pigment, diimmonium-based pigment, triarylmethane-based pigment, naphthoquinone-based pigment, anthraquinone-based pigment, squarylium-based pigment, phthalocyanine-based pigment, naphthalocyanine-based pigment, anthraquinone-based pigment, and nickel-dithiol-complex-based pigment.

The first solid-state image capture device 1 has a structure as described above.

[Modification of First Solid-State Image Capture Device]

Figure 2:
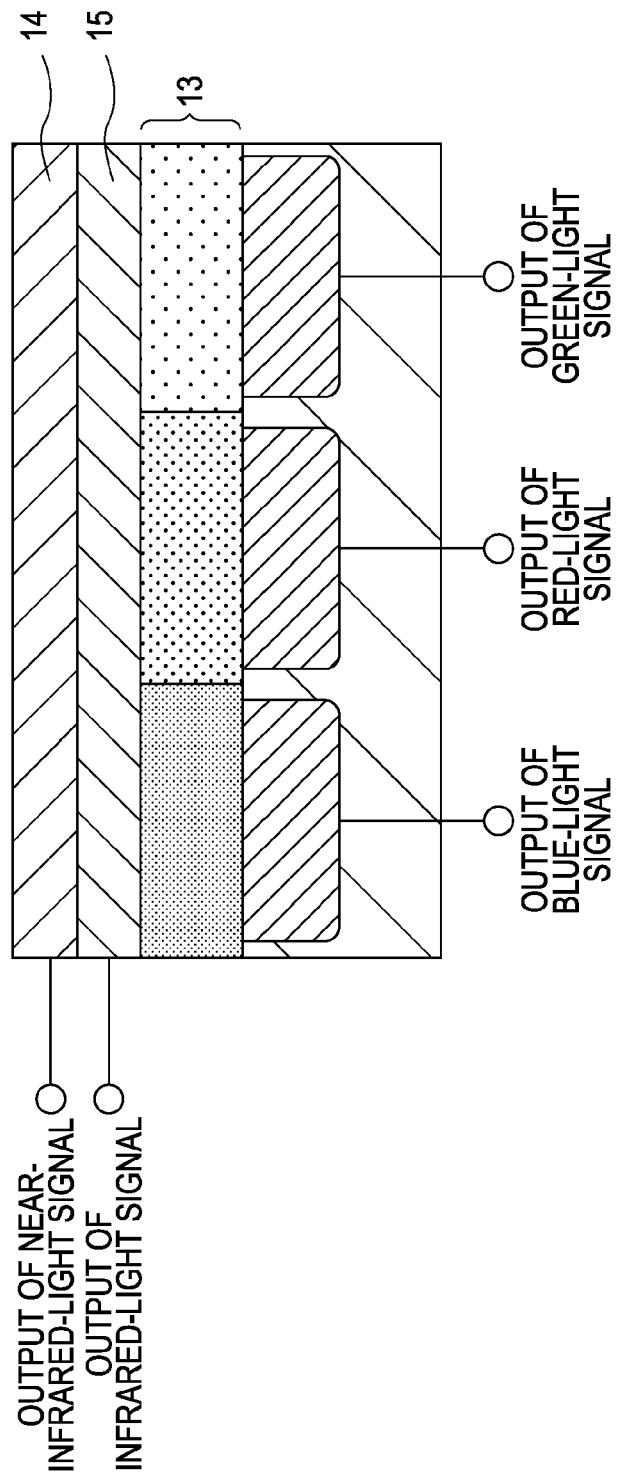
FIG. 2 is a schematic cross-sectional view showing a modification of the first solid-state image capture device.

As shown in FIG. 2, a photoelectric conversion layer 15 for absorbing light having a longer wavelength than the wavelength of the near infrared light may be provided between the color filter portions 13 and the organic photoelectric conversion layer 14.

In general, a very small number of types of silicon substrates absorb near infrared light and a very small number of types of color filters absorb near infrared light.

Figure 3:
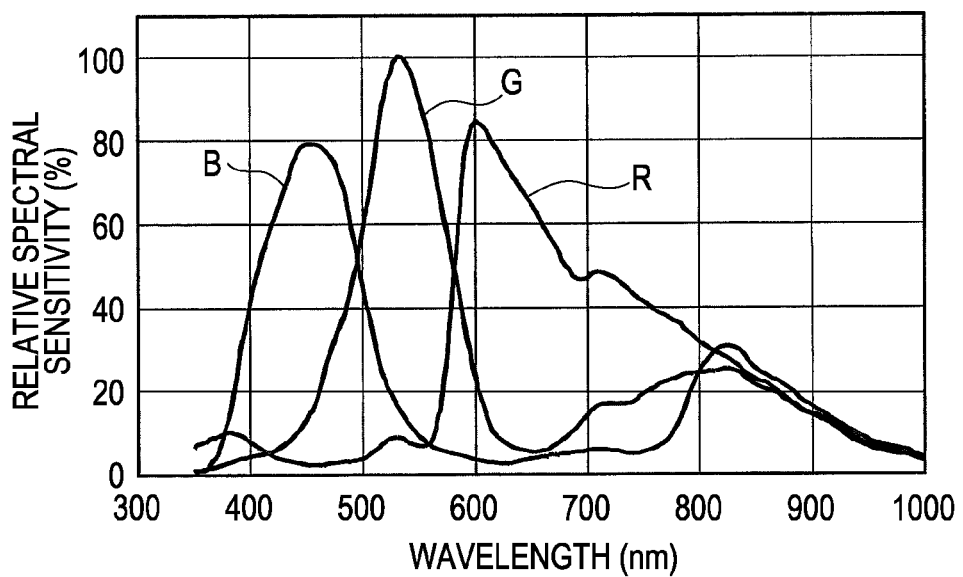
FIG. 3 is a graph showing spectral sensitivity characteristics of a typical solid-state image capture device.

A spectral sensitivity characteristic of a typical solid-state image capture device will now be described with reference to FIG. 3. In FIG. 3, the vertical axis indicates a relative spectral sensitivity and the horizontal axis indicates a wavelength.

As shown in FIG. 3, wavelengths ranges having a sensitivity of, for example, 200 or more are as follows.

A solid-state image capture element having a red color-filter portion has sensitivity (indicated by a spectral sensitivity curve R shown in FIG. 3) to light in a wavelength range of about 570 to 870 nm.

A solid-state image capture element having a green color-filter portion has sensitivity (indicated by a spectral sensitivity curve G shown in FIG. 3) to light in a wavelength range of about 460 to 600 nm and in a wavelength range of about 750 to 860 nm.

A solid-state image capture element having a blue color-filter portion has sensitivity (indicated by a spectral sensitivity curve B shown in FIG. 3) to light in a wavelength range of about 380 to 520 nm and in a wavelength range of about 790 to 880 nm.

The typical solid-state image capture device also has sensitivity to near infrared light.

In such a manner, the solid-state image capture elements having the typical color filter portions also have spectral sensitivity to near infrared light.

Thus, when such solid-state image capture device having the typical color filter portions is used as a solid-state image capture device for image capturing for a camera, an unnatural image is provided.

Accordingly, an IR cut filter has been generally disposed at the light incident side of the color filters to eliminate near infrared light from light that is incident on the color filter portions.

Figure 4:
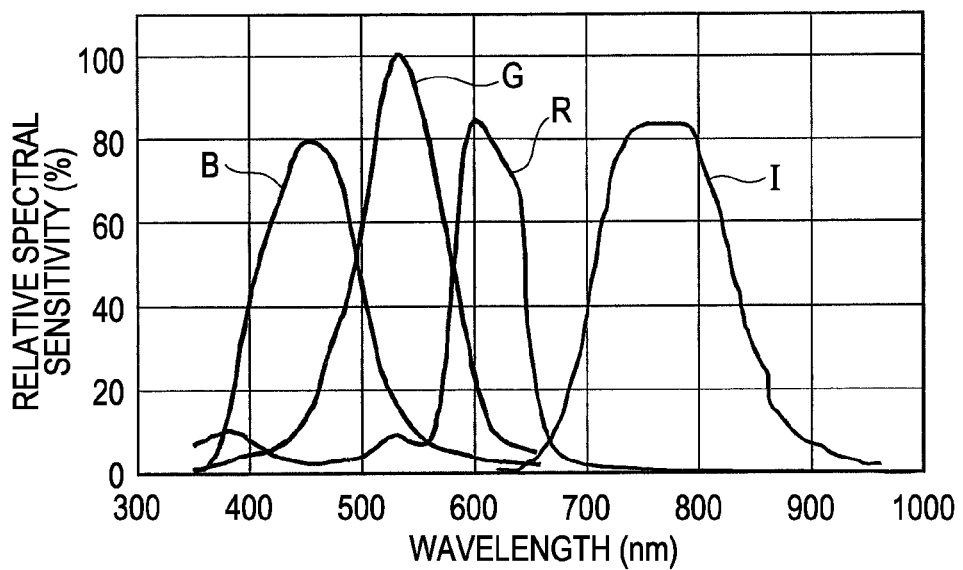
FIG. 4 is a graph showing spectral sensitivity characteristics of the first solid-state image capture device.

One example of relative spectral sensitivity characteristics of the solid-state image-capture elements 12 having the corresponding color filter portions 13 in the first solid-state image capture device 1 will now be described with reference to FIG. 4. In FIG. 4, the vertical axis indicates a relative spectral sensitivity and the horizontal axis indicates a wavelength.

As shown in FIG. 4, the solid-state image capture elements 12 exhibit a sensitivity of, for example, 20% or more in the following wavelength ranges.

The solid-state image capture element 12 (12R) having the red color-filter portion 13R has sensitivity (indicated by a spectral sensitivity curb R shown in FIG. 4) to light in a wavelength range of about 570 to 660 nm.

The solid-state image capture element 12 (12G) having the green color-filter portion 13G has sensitivity (indicated by a spectral sensitivity curb G shown in FIG. 4) to light in a wavelength range of about 460 to 600 nm.

The solid-state image capture element 12 (12B) having the blue color-filter portion 13B has sensitivity (indicated by a spectral sensitivity curb B shown in FIG. 4) to light in a wavelength range of about 380 to 520 nm.

The organic photoelectric conversion layer 14 containing the near-infrared-light absorbing pigment has sensitivity (indicated by a spectral sensitivity curb I shown in FIG. 4) to light in a wavelength range of about 680 to 860 nm.

Thus, the organic photoelectric conversion layer 14 absorbs light in a wavelength range of about 680 to 860 nm and transmits light having a wavelength that is shorter than the wavelength range.

Thus, light having a wavelength that is shorter than that of visible light enters the color filter portions 13.

Hence, visible light filtered by the color filters 13 arrive at the photoelectric conversion elements 12, so that the photoelectric conversion elements 12 corresponding to the respective color filter portions 13 can provide outputs having visible-light spectral sensitivities as indicated by the solid lines in FIG. 4.

Thus, the spectral sensitivity characteristics of the solid-state image capture elements 12, which have the color filter portions 13, in the first solid-state image capture device 1 exhibit no sensitivity to near infrared light. This is because the organic photoelectric conversion layer 14 absorbs light having a wavelength in a near infrared region.

Thus, light in a near infrared region does not enter the color filter portions 13.

As described above, the organic photoelectric conversion layer 14 has sensitivity to light in a wavelength range of about 680 to 860 nm.

Thus, each photoelectric conversion element 12 can output a visible-light signal and the organic photoelectric conversion layer 14 can output a near-infrared-light signal.

In short, the first solid-state image capture device 1 has a function for independently outputting a signal for a visible-light wavelength range and a signal for a near-infrared-light wavelength range.

With the structure having the photoelectric conversion layer 15 shown in FIG. 2, infrared light (e.g., light having a wavelength in the range of about 2.5 to 10 µm) that is not absorbed by the organic photoelectric conversion layer 14 is absorbed by the photoelectric conversion layer 15.

Consequently, no infrared light enters the color filter portions 13.

Thus, even if the color filter portions 13 also have sensitivity to infrared light, the photoelectric conversion elements 12 do not exhibit sensitivity to infrared light since no infrared light enters the color filter portions 13.

Although the first solid-state image capture device 1 has been described in conjunction with an example using the color filters for the primary colors, i.e., red (R), green (G), and blue (B), the color filters may be implemented by color filters for complementary colors including magenta (Mg), cyan (Cy), yellow (Ye), and green (G) or color filters for another combination of colors.

In FIG. 1, only the photoelectric converters (the photodiodes) are shown for simplification of illustration. A method for reading signal charges resulting from the photoelectric conversion performed by the photoelectric converters may employ any system, such as a charge transfer system (e.g., a CCD [charge coupled device] image sensor) or a system (e.g., a CMOS [complementary metal oxide semiconductor] image sensor) in which each pixel is provided with a read gate.

2. Second Embodiment

One Example in which Configuration of First Solid-State Image Capture Device 1 is Applied to CMOS Image Sensor One example in which the configuration of the first solid-state image capture device 1 is applied to a CMOS image sensor will now be described with reference to a schematic cross-sectional view shown in FIG. 5.

Figure 5:
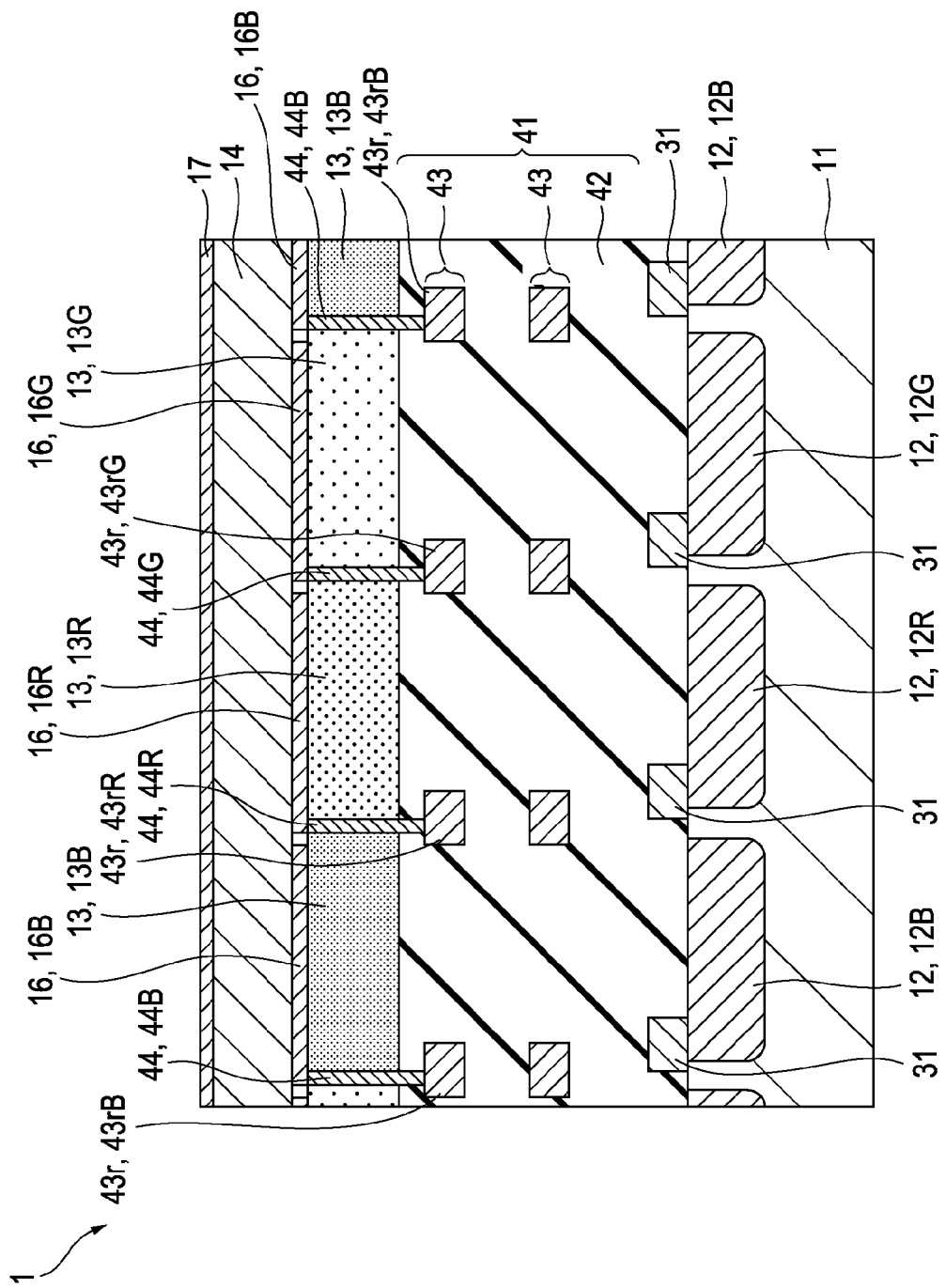
FIG. 5 is a schematic cross-sectional view showing one example in which the configuration of the first solid-state image capture device is applied to a CMOS image sensor.

As shown in FIG. 5, a semiconductor substrate 11 has photoelectric conversion elements 12 (12R, 12G, and 12B) that perform photoelectric conversion on incident light to obtain signal charges. Each photoelectric conversion element 12 is implemented by, for example, a photodiode. The semiconductor substrate 11 may be, for example, a silicon substrate. Alternatively, the semiconductor substrate 11 may be a SOI substrate or a substrate obtained by forming a silicon epitaxial growth layer on a silicon layer of a SOI substrate.

Transfer gates 31 for reading signal charges resulting from the photoelectrical conversion performed by the photoelectric conversion elements 12 are provided on the semiconductor substrate 11. The transfer gates 31 have gate electrodes formed on, for example, gate insulating layers, although details thereof are not shown. Although not shown, the semiconductor substrate 11 has pixel transistors and peripheral circuits adjacent to the transfer gates 31 with floating diffusions interposed therebetween. Examples of the pixel transistors include a reset transistor, an amplifying transistor, and a selecting transistor.

A multilayered wiring portion 41 that covers the pixel transistors and the peripheral circuits are provided on the semiconductor substrate 11. In the multilayered wiring portion 41, wiring lines 43 are provided in multi layers (e.g., two layers in FIG. 5) in an insulating layer 42. The number of wiring layers is not limited to two and thus may be three, four, or more.

Color filter portions 13 are provided on the insulating layer 42 of the multilayered wiring portion 41.

For example, a color filter portion 13 (a red color-filter portion 13R) for absorbing red light is provided so as to correspond to the photoelectric conversion element 12 (12R). A color filter portion 13 (a green color-filter portion 13G) for absorbing green light is provided so as to correspond to the photoelectric conversion element 12 (12G). Further, a color filter portion 13 (a blue color-filter portion 13B) for absorbing blue light is provided so as to correspond to the photoelectric conversion element 12 (12B).

Transparent electrodes 16 are provided on the upper surfaces of the corresponding color filter portions 13. The transparent electrodes 16 are connected to corresponding signal-reading wiring lines 43r of the wiring lines 43 through corresponding signal-reading contact portions 44.

That is, a transparent electrode 16 (16R) is provided on the red (R) color filter portion 13R and is connected to a signal-reading wiring line 43r (43rR) through a contact portion 44 (44R).

A transparent electrode 16 (16G) is provided on the green (G) color filter portion 13G and is connected to a signal-reading wiring line 43r (43rG) through a contact portion 44 (44G).

A transparent electrode 16 (16B) is provided on the blue (B) color filter portion 13B and is connected to a signal-reading wiring line 43r (43rB) through a contact portion 44 (44B).

The transparent electrodes 16 may be implemented by transparent electrodes that transmit visible light and near infrared light and that contain, for example, indium tin oxide (ITO), indium zinc oxide, or zinc oxide.

An organic photoelectric conversion layer 14 containing a pigment that is absorptive of near infrared light is provided at light incident sides of the color filter portions 13. The term "near infrared light" refers to light having a wavelength in the range of, for example, 770 nm to 2.5 μm.

The near-infrared-light absorbing pigment used for the organic photoelectric conversion layer 14 can be used based on a desired spectral characteristic and an output sensitivity characteristic. Examples of the pigment include a quinoid-based metal complex pigment, cyanine-based pigment, immonium-based pigment, diimmonium-based pigment, triarylmethane-based pigment, naphthoquinone-based pigment, anthraquinone-based pigment, squarylium-based pigment, phthalocyanine-based pigment, naphthalocyanine-based pigment, anthraquinone-based pigment, and nickel-dithiol-complex-based pigment.

A transparent electrode 17 is provided on the upper surface of the organic photoelectric conversion layer 14.

The transparent electrode 17 may be implemented by a transparent electrode that transmits visible light and near infrared light and that contains, for example, indium tin oxide (ITO), indium zinc oxide, or zinc oxide.

The first solid-state image capture device 1 has a structure as described above.

In the first solid-solid image capture device 1, the organic photoelectric conversion layer 14 performs photoelectric conversion on near infrared light to obtain signal charge corresponding to near infrared light. Thus, under a condition that the amount of incident light is small, like at night, it is possible to use the signal charge from the organic photoelectric conversion layer 14 in addition to the signal charge from the photoelectric conversion elements 12, thus enhancing the sensitivity. Under a condition that the amount of incident light is large, like during the daytime, the photoelectric conversion elements 12 obtain, for example, regular red-light, green-light, and blue-light signal charges without changing the typical arrangement of the color filter portions 13, such as a Bayer arrangement, for the solid-state image capture elements 12. Alternatively, the photoelectric conversion elements 12 may obtain complementary-color-light signal charges.

Thus, the first solid-state image capture device 1 can obtain high-sensitivity output signals without using an IR cut filter and without changing the typical arrangement of the color filter portions 13 for the solid-state image capture elements 12, thus making it possible to perform image capture even under a condition that the amount of incident light is small without a deterioration of color reproduction and a reduction in color resolution under a condition that the amount of incident light is large.

3. Third Embodiment

Second Example of Basic Configuration of Second Solid-State Image Capture Device A second example of a basic configuration of a second solid-state image capture device according to a second embodiment of the present invention will now be described with reference to a schematic cross-sectional view shown in FIG. 6.

Figure 6:
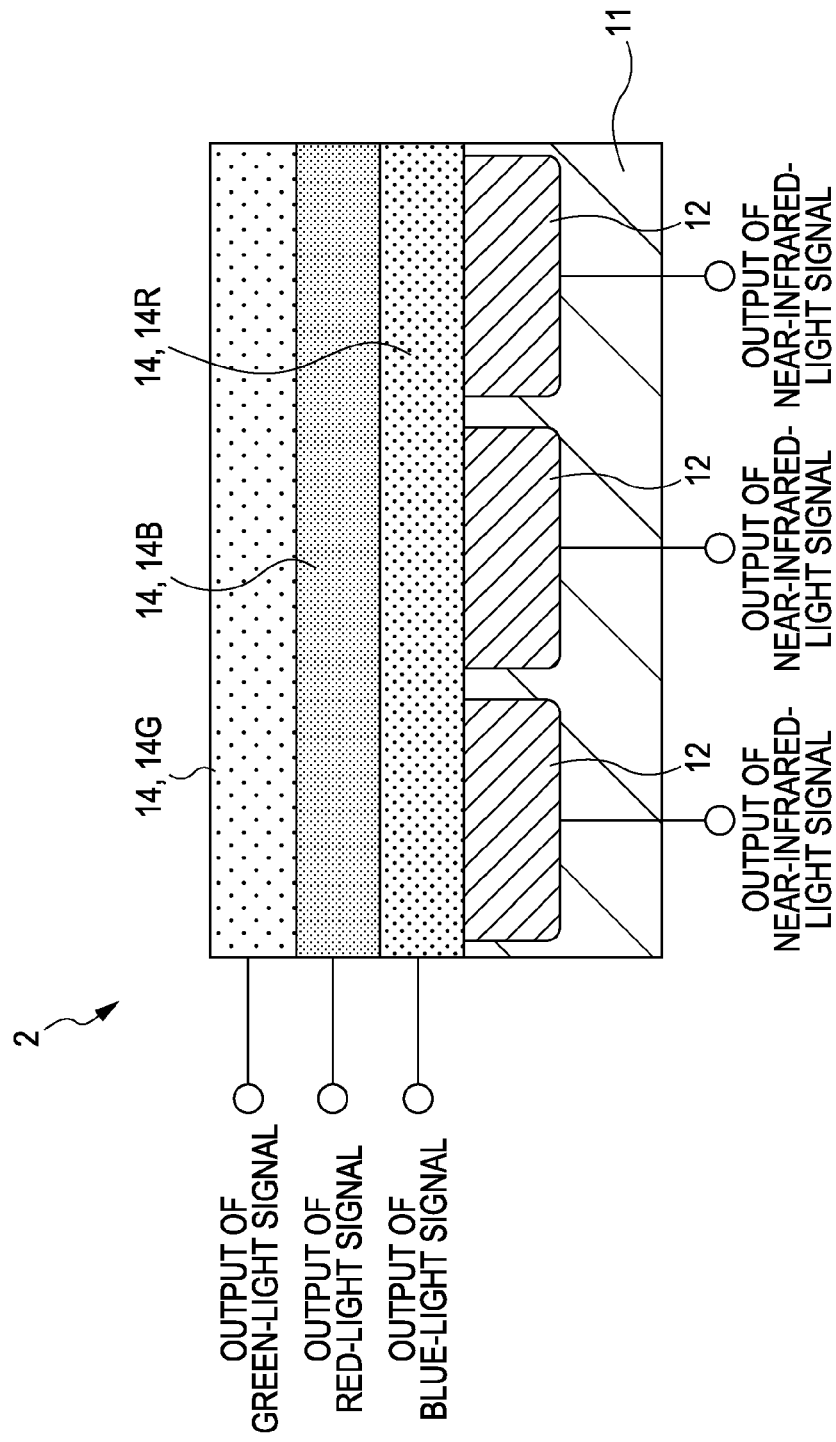
FIG. 6 is a schematic cross-sectional view showing a first example of a basic configuration of a second solid-state image capture device according to a second embodiment of the present invention.

As shown in FIG. 6, a semiconductor substrate 11 has photoelectric conversion elements 12 that perform photoelectric conversion on incident light to obtain signal charges. Each photoelectric conversion element 12 absorbs near infrared light, performs photoelectric conversion thereon, and outputs resulting signal charge. Each photoelectric conversion element 12 is implemented by, for example, a photodiode. The term "near infrared light" refers to light having a wavelength in the range of, for example, 770 nm to 2.5 µm.

The semiconductor substrate 11 may be, for example, a silicon substrate. Alternatively, the semiconductor substrate 11 may be a SOI substrate or a substrate obtained by forming a silicon epitaxial growth layer on a silicon layer of a SOI substrate.

Organic photoelectric conversion layers 14 are provided at light incident sides at which incident light enters the photoelectric conversion elements.

For example, an organic photoelectric conversion layer 14 (a red organic photoelectric conversion layer 14R) for absorbing red light is provided on the photoelectric conversion elements 12. On the organic photoelectric conversion layer 14R, an organic photoelectric conversion layer 14 (a blue organic photoelectric conversion layer 14B) for absorbing blue light is provided. Further, on the organic photoelectric conversion layer 14B, an organic photoelectric conversion layer 14 (a green organic photoelectric conversion layer 14G) for absorbing green light is provided. The organic photoelectric conversion layers 14 provide outputs of the corresponding colors.

The second solid-state image capture device 2 has a structure as described above.

Figure 7:
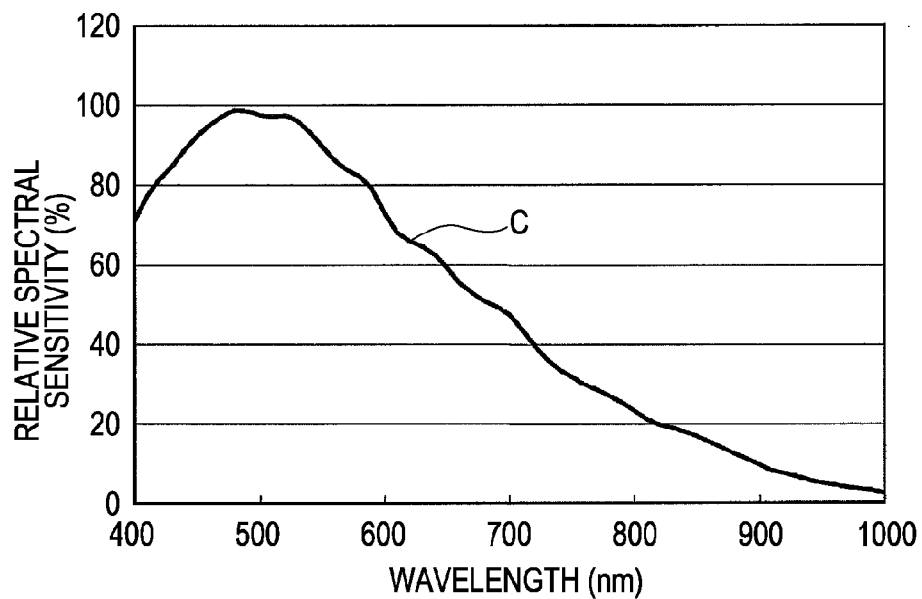
FIG. 7 is a graph showing a spectral sensitivity characteristic of a typical solid-state image capture element.

A spectral sensitivity characteristic of a typical solid-state image capture element will now be described with reference to FIG. 7. In FIG. 7, the vertical axis indicates a relative spectral sensitivity and the horizontal axis indicates a wavelength.

As shown in FIG. 7, a wavelength range having a sensitivity of, for example, 200 or more is as follows.

The typical solid-state image capture element has sensitivity (indicated by a spectral sensitivity curve C in FIG. 7) to wavelengths of visible light to near infrared light.

Thus, when a solid-state image capture device having typical color filter portions is used as a solid-state image capture device for image capturing for a camera, an unnatural image is provided.

Accordingly, an IR cut filter has been generally disposed at the light incident side of the color filters to eliminate near infrared light from light that is incident on the color filter portions.

Figure 8:
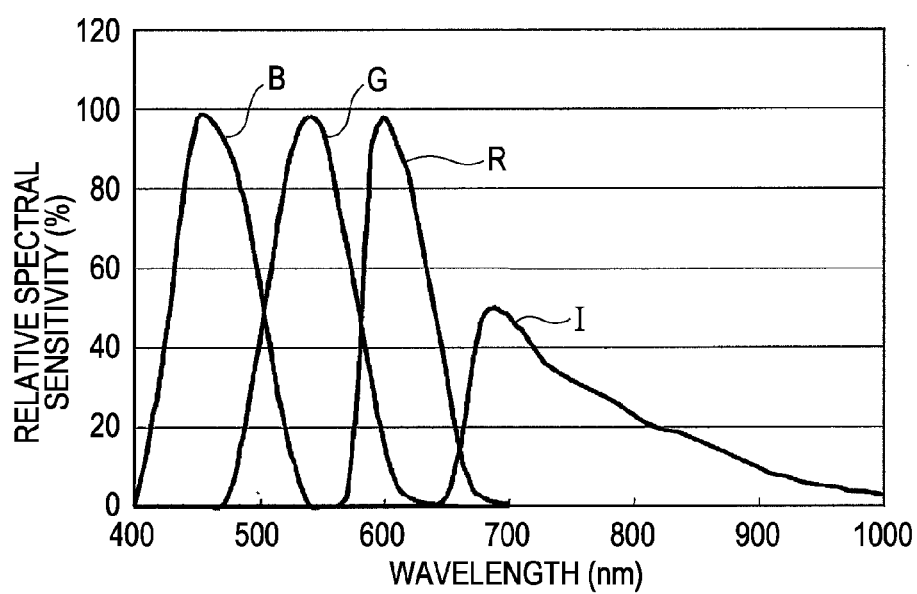
FIG. 8 is a graph showing spectral sensitivity characteristics of the second solid-state image capture device.

One example of relative spectral sensitivity characteristics of the organic photoelectric conversion layers 14 and the solid-state image-capture elements 12 in the second solid-sate image capture device 2 will now be described with reference to FIG. 8. In FIG. 8, the vertical axis indicates a relative spectral sensitivity and the horizontal axis indicates a wavelength.

As shown in FIG. 8, wavelength ranges having a sensitivity of, for example, 20% or more are as follows.

The red organic photoelectric conversion layer 14R has sensitivity (a spectral sensitivity curve R shown in FIG. 8) to light in a wavelength range of about 575 to 655 nm.

The green organic photoelectric conversion layer 14G has sensitivity (a spectral sensitivity curve G shown in FIG. 8) to light in a wavelength range of about 485 to 595 nm.

The blue organic photoelectric conversion layer 14B has sensitivity (a spectral sensitivity curve B shown in FIG. 8) to light in a wavelength range of about 415 to 520 nm.

The solid-state image capture elements 12 using the near-infrared-light absorbing pigment have sensitivity (indicated by a spectral sensitivity curb I shown in FIG. 8) to light in a wavelength range of about 660 to 820 nm.

Thus, the organic photoelectric conversion layers 14 absorb light in a wavelength range of about 415 to 655 nm and exhibit no sensitivity to near infrared light. Thus, since the organic photoelectric conversion layers 14 transmit light in a near infrared range, near infrared light is incident on the solid-state image capture elements 12 and is absorbed thereby.

Consequently, visible light is filtered and absorbed by the organic photoelectric conversion layers 14 and resulting signals are output therefrom. Thus, the photoelectric conversion elements 12 can provide outputs having near-infrared-light spectrum sensitivity as indicated by the spectrum sensitivity curve I shown in FIG. 8.

In short, the second solid-state image capture device 2 has a function for independently outputting a signal for a visible-light wavelength range and a signal for a near-infrared-light wavelength range.

Although the second solid-state image capture device 2 has been described in conjunction with an example using the organic photoelectric conversion layers for the primary colors, i.e., red (R), green (G), and blue (B), the organic photoelectric conversion layers may be implemented by organic photoelectric conversion layers for complementary colors including magenta (Mg), cyan (Cy), yellow (Ye), and green (G) or organic photoelectric conversion layers for another combination of colors.

In FIG. 6, only the photoelectric converters (the photodiodes) are shown for simplification of illustration. A method for reading signal charges resulting from the photoelectric conversion performed by the photoelectric converters may employ any system, such as a charge transfer system (e.g., a CCD image sensor) or a system (e.g., a CMOS image sensor) in which each pixel is provided with a read gate.

4. Fourth Embodiment

One Example in which Configuration of Second Solid-State Image Capture Device 2 is applied to CMOS Image Sensor One example in which the configuration of the second solid-state image capture device 2 described above is applied to a CMOS image sensor will now be described with reference to a schematic cross-sectional view shown in FIG. 9.

Figure 9:
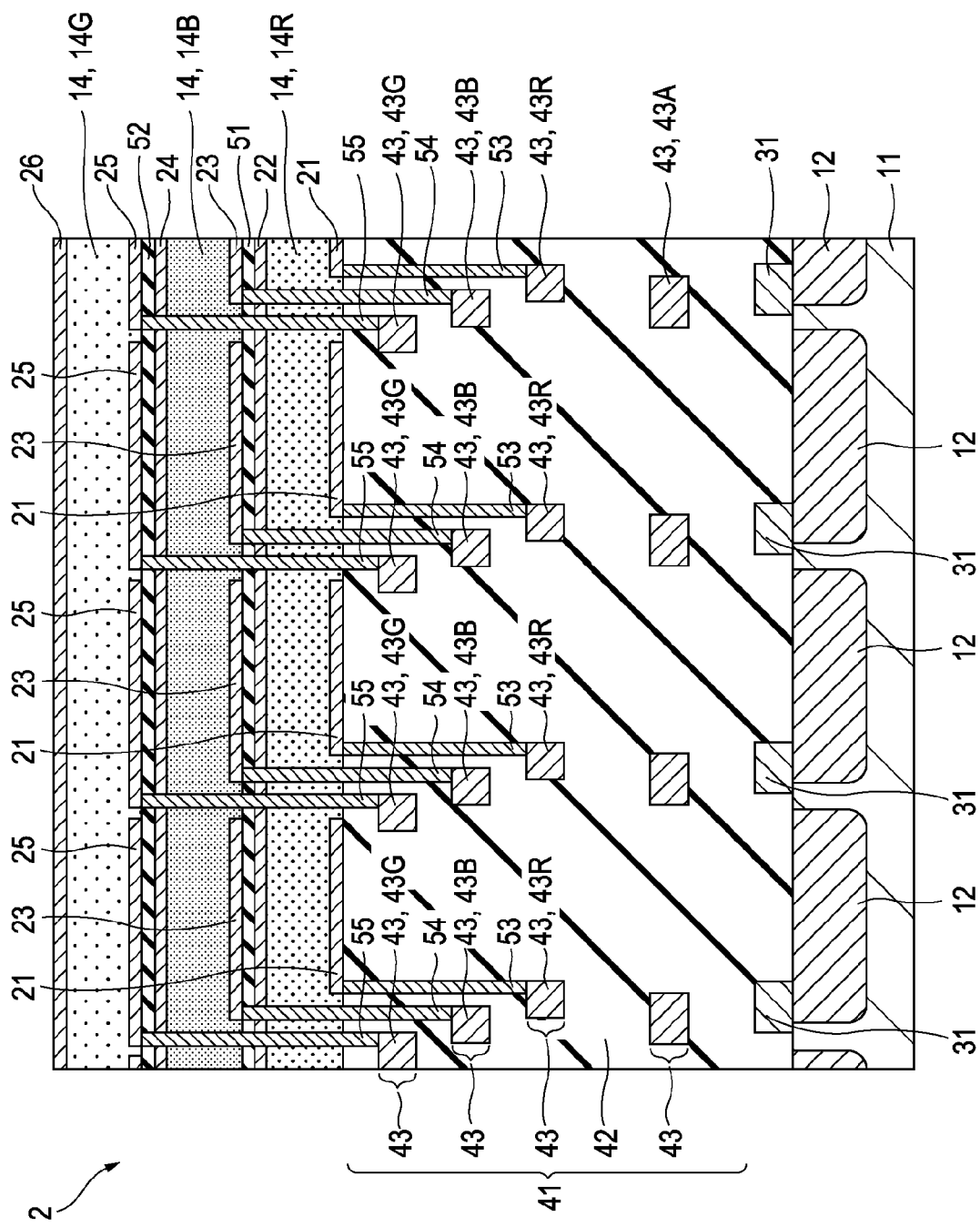
FIG. 9 is a schematic cross-sectional view showing one example in which the configuration of the second solid-state image capture device is applied to a CMOS image sensor.

As shown in FIG. 9, a semiconductor substrate 11 has photoelectric conversion elements 12 that perform photoelectric conversion on incident light to obtain signal charges. Each photoelectric conversion element 12 absorbs near infrared light, performs photoelectric conversion thereon, and outputs resulting signal charge. Each photoelectric conversion element 12 is implemented by, for example, a photodiode.

The term "near infrared light" refers to light having a wavelength in the range of, for example, 770 nm to 2.5 μm.

The semiconductor substrate 11 may be, for example, a silicon substrate. Alternatively, the semiconductor substrate 11 may be a SOI substrate or a substrate obtained by forming a silicon epitaxial growth layer on a silicon layer of a SOI substrate.

Transfer gates 31 for reading signal charges resulting from the photoelectrical conversion performed by the photoelectric conversion elements 12 are provided on the semiconductor substrate 11.

A multilayered wiring portion 41 that covers pixel transistors and peripheral circuits are provided on the semiconductor substrate 11. In the multilayered wiring portion 41, wiring lines 43 (43A, 43R, 43B, and 43G) are provided in multi layers (e.g., four layers in FIG. 9) in an insulating layer 42. The number of wiring layers is not limited to four and may be two, three, or five or more.

Red reading transparent electrodes 21 are provided on the insulating layer 42 in the multilayered wiring portion 41 so as to correspond to the photoelectric conversion elements 12. An organic photoelectric conversion layer 14 (a red organic photoelectric conversion layer 14R) for absorbing red light is provided over the red reading transparent electrodes 21. A transparent electrode 22 is provided on the red organic photoelectric conversion layer 14R. An insulating layer 51 is further provided on the transparent electrode 22.

Blue reading transparent electrodes 23 are provided on the insulating layer 51 so as to correspond to the photoelectric conversion elements 12. An organic photoelectric conversion layer 14 (a blue organic photoelectric conversion layer 14B) for absorbing blue light is provided over the blue reading transparent electrodes 23. A transparent electrode 24 is provided on the blue organic photoelectric conversion layer 14B. An insulating layer 52 is further provided on the transparent electrode 24.

Green reading transparent electrodes 25 are provided on the insulating layer 52 so as to correspond to the photoelectric conversion elements 12. An organic photoelectric conversion layer 14 (a green organic photoelectric conversion layer 14G) for absorbing green light is provided over the green reading transparent electrodes 25. A transparent electrode 26 is further provided on the green organic photoelectric conversion layer 14G.

The red reading transparent electrodes 21 are connected to, for example, the wiring lines 43 (the signal reading wiring lines 43R) in the second layer through corresponding contact portions 53. The blue reading transparent electrodes 23 are connected to, for example, the wiring lines 43 (the signal reading wiring lines 43B) in the third layer through corresponding contact portions 54. The green reading transparent electrodes 25 are connected to, for example, the wiring lines 43 (the signal reading wiring lines 43G) in the fourth layer through corresponding contact portions 55.

Other wiring lines are further included in the wiring lines (43A) in the first layer.

The transparent electrodes 21 to 26 may be implemented by transparent electrodes that transmit visible light and near infrared light and that contain, for example, indium tin oxide (ITO), indium zinc oxide, or zinc oxide.

The second solid-state image capture device 2 has a structure as described above.

In the second solid-solid image capture device 2, the organic photoelectric conversion elements 12 perform photoelectric conversion on near infrared light to obtain signal charges corresponding to the near infrared light. Thus, under a condition that the amount of incident light is small, like at night, it is possible to use the signal charges from the photoelectric conversion elements 12 in addition to the signal charges from the photoelectric conversion layers 14, thus enhancing the sensitivity. Under a condition that the amount of incident light is large, like during the daytime, the organic photoelectric conversion layers 14 obtain, for example, regular red-light, green-light, and blue-light signal charges.

Thus, the second solid-state image capture device 2 can provide high-sensitivity output signals without using an IR cut filter and without changing the arrangement of the organic photoelectric conversion layers 14, thus making it possible to perform image capture even under a condition that the amount of incident light is small without a deterioration of color reproduction and a reduction in color resolution under a condition that the amount of incident light is large.

5. Fifth Embodiment

Example of Basic Configuration of Image Capture Apparatus

One example of the configuration of an image capture apparatus according to a fifth embodiment of the present invention will now be described with reference to a block diagram shown in FIG. 10. Examples of the image capture apparatus include a video camera, a digital still camera, and a camera for a mobile phone.

Figure 10:
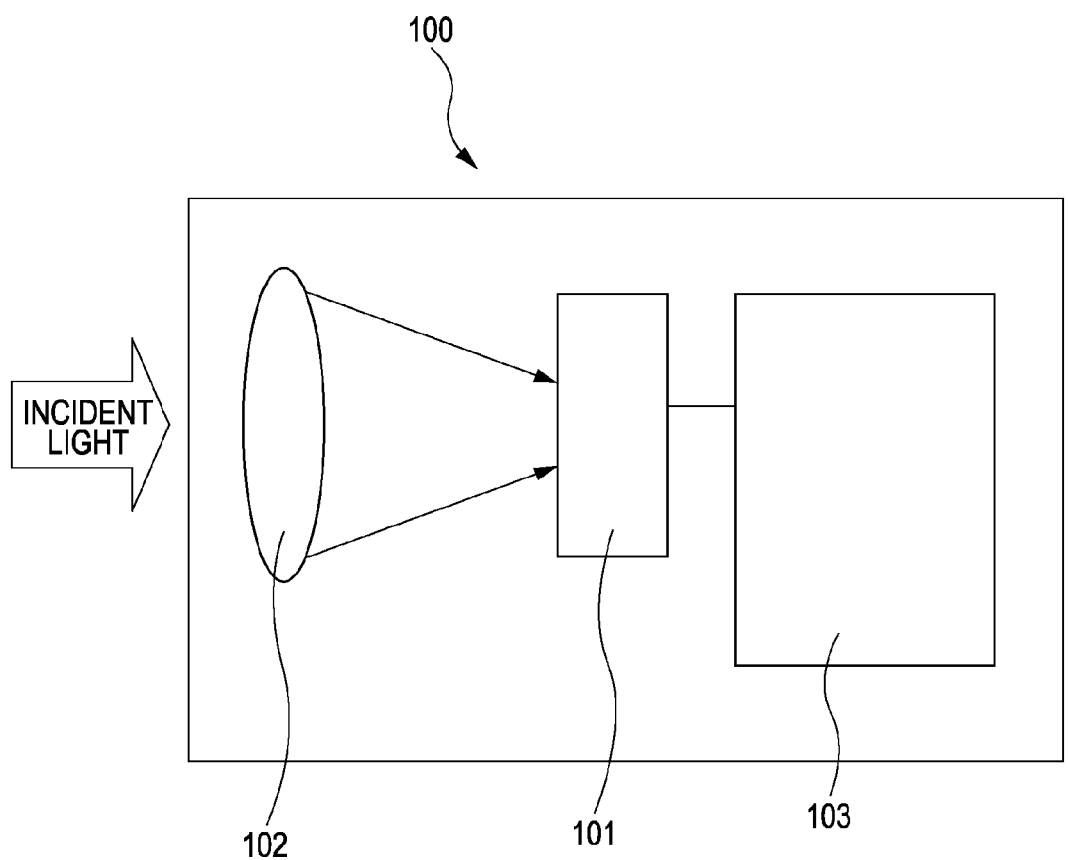
FIG. 10 is a block diagram showing one example of the configuration of an image capture apparatus according to a fifth embodiment of the present invention.

As shown in FIG. 10, an image capture apparatus 100 includes an image capture section 101, an image-forming optical section 102, and a signal processor 103. The image capture section 101 has a solid-state image capture device (not shown). The image-forming optical section 102 is provided at a light-condensing side of the image capture section 101 to form an image. The signal processor 103 is connected to the image capture section 101 and has a drive circuit, a signal processing circuit, and so on. The driver circuit drives the image capture section 101 and the signal processing circuit processes signals, resulting from photoelectric conversion performed by the solid-state image capture device, to generate image signals. The image signals processed by the signal processor 103 can be stored in an image storage section (not shown).

Under a condition that the amount of incident light is large, the signal processor 103 performs signal processing based on red-light, green-light, and blue-light signals output from the solid-state image capture device and outputs color image signals. On the other hand, under a condition that the amount of incident light is small, the signal processor 103 performs signal processing on a mixture of red-light, green-light, blue-light, and near-infrared-light signals output from the solid-state image capture device and outputs grayscale image signals.

As the solid-state image capture device in the image capture apparatus 100, the first solid-state image capture device 1 described above or the second solid-state image capture device 2 described above can be used.

A case in which the first solid-state image capture device 1 is used will now be described in detail.

When the amount of incident light is sufficient like during the daytime, it is possible to output regular color-image signals by performing processing using visible-light signals output from the photoelectric conversion elements 12 (see FIGS. 1 and 5). In this case, since near infrared light that deteriorates color reproduction is absorbed by the organic photoelectric conversion layer 14 (see FIGS. 1 and 5), it is not necessary to apply an IR cut filter typically used. It is therefore possible to miniaturize the image capture apparatus 100.

On the other hand, when the amount of incident light is small, like at night, it is possible to generate brighter-image signals by using the near-infrared-light signals output from the organic photoelectric conversion layer 14 (see FIGS. 1 and 5) in addition to the visible-light signals output from the photoelectric conversion elements 12 (see FIGS. 1 and 5). In this case, since the near-infrared-light signals can be output from all areas corresponding to the photoelectric conversion elements 12, the resolution of an image is not reduced compared to an image obtained during the daytime. Also, when the amount of incident light is small, the amount of color information is reduced. Thus, performing grayscale-image processing can eliminate de-mosaic processing used for color image generation for the image solid-state image capture elements having two-dimensionally arranged color filters and can suppress aliasing.

During image capture where the amount of incident light is small, the amount of dark noise and so on increases relative to the amount of signal output from the photoelectric conversion elements 12. Thus, it is also possible to generate a grayscale image through the use of only near-infrared-light signals output from the organic photoelectric conversion layer 14.

Combination with a system for detecting ambient brightness makes it possible to automate switching to the image generation using the near-infrared-light signals. Such an arrangement can be realized by, for example, adding a sensor for detecting ambient brightness and a circuit for monitoring the amount of visible-light signal and feeding the signal back to the signal processing circuit.

The visible-light signals and near-infrared-light signals to be used can be electrically switched. Since such an arrangement does not use a mechanical mechanism, it is possible to manufacture compact, low-cost cameras used for both daytime and nighttime.

[One Example of Signal Processing]

Figure 11:
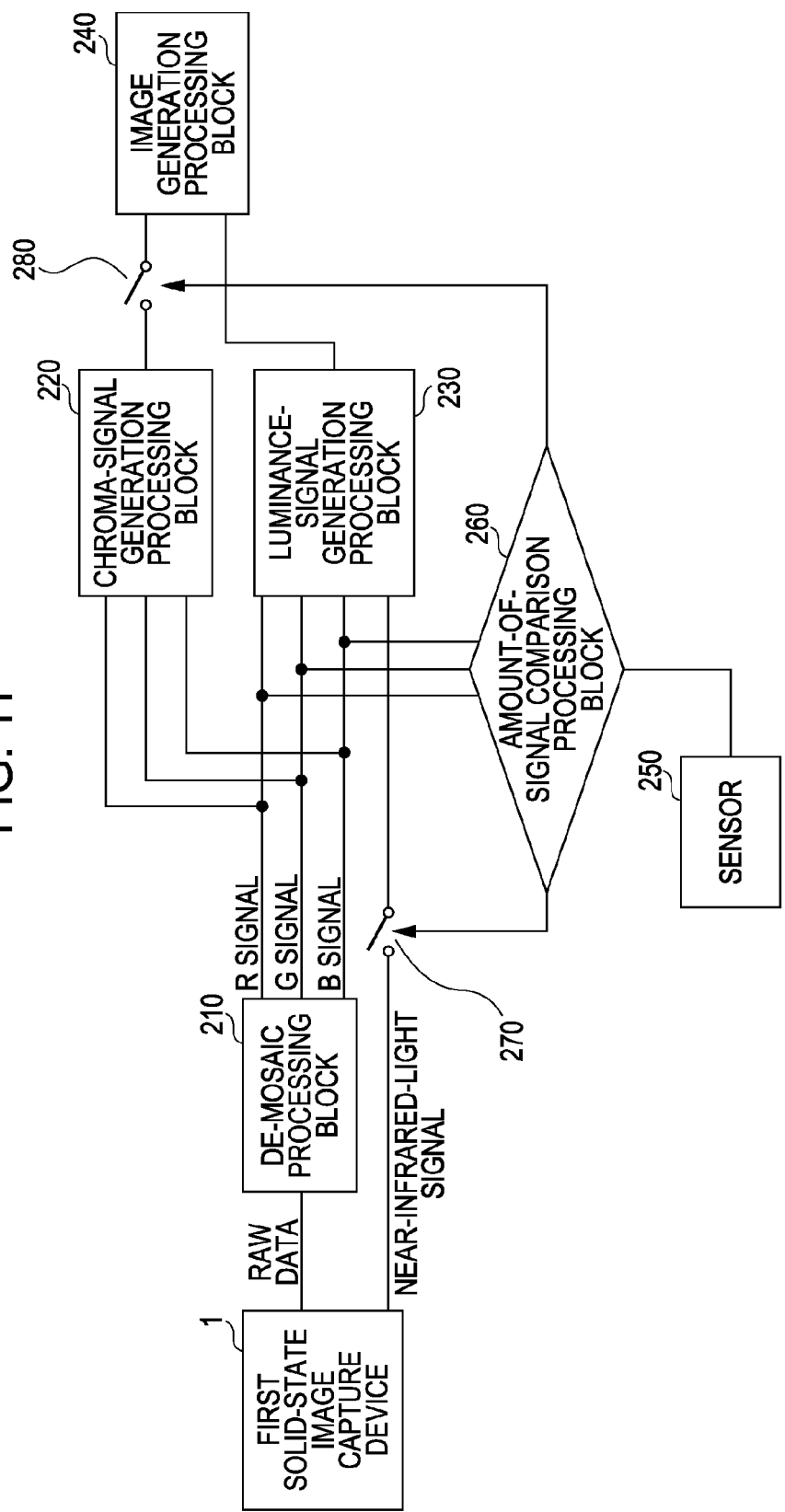
FIG. 11 is a block diagram showing one example of signal processing of the image capture apparatus.

For example, as shown in FIG. 11, signal charge, for example, raw data, resulting from photoelectric conversion performed by the first solid-state image capture device 1 is divided by a de-mosaic processing block 210 into a red-light (R) signal, green-light (G) signal, and blue-light (B) signal. On the basis of these signals, a chroma-signal generation processing block 220 generates chroma signals and a luminance-signal generation processing block 230 generates luminance signals. On the basis of the generated chroma signals and the luminance signals, an image generation processing block 240 generates an image.

A sensor 250 is provided to detect ambient brightness. On the basis of the ambient brightness detected by the sensor 250 or on the basis of a brightness obtained by adding the amounts of the red-light (R) signal, the green-light (G) signal, and the blue-light (B) signal to the ambient brightness detected by the sensor 250, an amount-of-signal comparison processing block 260 determines whether or not to use near infrared light.

When near infrared light is to be used, a switch 270 is turned on to send the near-infrared-light signals to the luminance-signal generation processing block 230. In this case, the luminance-signal generation processing block 230 generates luminance signals by adding the near-infrared-light signals to the red-light (R) signal, the green-light (G) signal, and the blue-light (B) signal.

On the other hand, when the near infrared light is not to be used, the switch 270 is turned off, so that the near-infrared-light signals are not sent to the luminance-signal generation processing block 230. In this case, the luminance-signal generation processing block 230 generates luminance signals using only the red-light (R) signal, the green-light (G) signal, and the blue-light (B) signal.

When an image is to be generated using only near infrared light, the amount-of-signal comparison processing block 260 turns off a switch 280, so that the image generation processing block 240 generates an image by using only the luminance signals.

A case in which the second solid-state image capture device 2 is used will now be described in detail.

When the amount of incident light is sufficient, like during the daytime, it is possible to output regular color-image signals by performing processing using visible-light signals output from the organic photoelectric conversion layers 14R, 14G, and 14B (see FIGS. 6 and 9). In this case, since the organic photoelectric conversion layers 14R, 14G, and 14B are not absorptive of near infrared light that deteriorates color reproduction, no near infrared light is output. Thus, it is not necessary to apply an IR cut filter typically used. Thus, it is possible to miniaturize the image capture apparatus 100.

Since the organic photoelectric conversion layers 14R, 14G, and 14B are arranged in multiple layers, typical solid-state image capture elements based on an RGB color filter system having a Bayer arrangement can be provided with a high-color-resolution image.

On the other hand, when the amount of incident light is small, like at night, it is possible to generate brighter-image signals by using the near-infrared-light signals output from the photoelectric conversion elements 12 in addition to the visible-light signals output from the organic photoelectric conversion layers 14R, 14G, and 14B.

Since the amount of color information is reduced at a scene where the amount of incident light is small, it is possible to reduce the amount of color noise that becomes more prominent as the brightness is reduced through grayscale image processing.

During image capture where the amount of incident light is small, the amount of dark noise and so on increases relative to the amount of signal output from the organic photoelectric conversion layers 14R, 14G, and 14B. Thus, it is also possible to generate a grayscale image through the use of only near-infrared-light signals output from the photoelectric conversion elements 12.

Combination with a system for detecting ambient brightness makes it possible to automate switching to the image generation using the near-infrared-light signals. Such an arrangement can be realized by, for example, adding a sensor for detecting ambient brightness and a circuit for monitoring the amount of visible-light signal and feeding the signal back to the signal processing circuit.

The visible-light signals and near-infrared-light signals to be used can be electrically switched. Since such an arrangement does not use a mechanical mechanism, it is possible to manufacture compact, low-cost cameras used for both daytime and nighttime.

[Another Example of Signal Processing]

Figure 12:
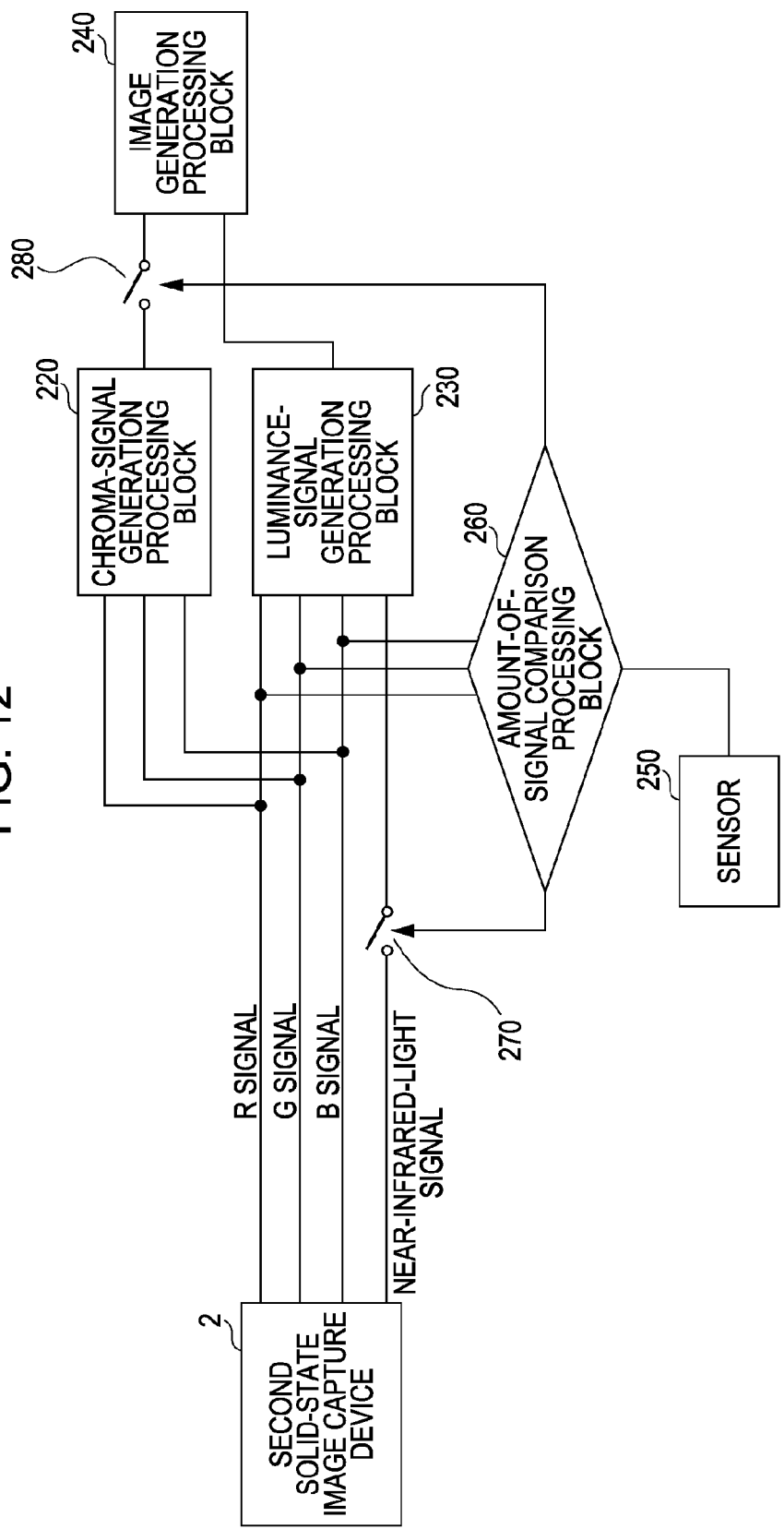
FIG. 12 is a block diagram showing another example of signal processing of the image capture apparatus.

For example, as shown in FIG. 12, the second solid-state image capture device 2 performs photoelectric conversion to output signal charges, for example, a red-light (R) signal, green-light (G) signal, and blue-light (B) signal. On the basis of the output red-light (R) signal, green-light (G) signal, and blue-light (B) signal, a chroma-signal generation processing block 220 generates chroma signals and a luminance-signal generation processing block 230 generates luminance signals. On the basis of the generated chroma signals and the luminance signals, an image generation processing block 240 generates an image.

A sensor 250 is provided to detect ambient brightness. On the basis of the ambient brightness detected by the sensor 250 or on the basis of a brightness obtained by adding the amounts of the red-light (R) signal, the green-light (G) signal, and the blue-light (B) signal to the ambient brightness detected by the sensor 250, an amount-of-signal comparison processing block 260 determines whether or not to use near infrared light.

When near infrared light is to be used, a switch 270 is turned on to send the near-infrared-light signals to the luminance-signal generation processing block 230. In this case, the luminance-signal generation processing block 230 generates luminance signals by adding the near-infrared-light signals to the red-light (R) signal, the green-light (G) signal, and the blue-light (B) signal.

On the other hand, when near infrared light is not to be used, the switch 270 is turned off, so that the near-infrared-light signals are not sent to the luminance-signal generation processing block 230. In this case, the luminance-signal generation processing block 230 generates luminance signals using only the red-light (R) signal, the green-light (G) signal, and the blue-light (B) signal.

When an image is to be generated using only near infrared light, the amount-of-signal comparison processing block 260 turns off a switch 280, so that the image generation processing block 240 generates an image by using only the luminance signals.

Under a condition that the amount of incident light is small, this image capture apparatus 100 performs signal processing on a mixture of red-light, green-light, blue-light, and near-infrared-light signals output from the solid-state image capture device and outputs a grayscale image signal. This arrangement, therefore, enhances the sensitivity, thereby making it easy to perform photography at night. Under a condition that the amount of incident light is large, it is possible to perform color-image photography without a deterioration of color reproduction and a reduction in color resolution.

Since the first solid-state image capture device 1 or the second solid-state image capture device 2 according to the embodiments of the present invention is used, the image capture apparatus 100 has an advantage in that image capture can be performed even under a condition that the amount of incident light is small without a deterioration of color reproduction and a reduction in color resolution under a condition that the amount of incident light is large.

In addition, since this arrangement can independently output the visible-light signals and the near-infrared-light signals, it is possible to provide a miniaturized image capture apparatus without use of an IR cut filter that has been commonly included in a typical image capture apparatus.

Additionally, by utilizing the capability to independently output the visible-light signals and the near-infrared-light signals, it is also possible to provide a compact, low-cost image capture apparatus used for both daytime and nighttime without use of a mechanical mechanism.

The image capture apparatus 100 is not limited to the above-described configuration and is thus applicable to any configuration of an image capture apparatus that uses a solid-state image capture device.

The first solid-state image capture device 1 or the second solid-state image capture device 2 may take a form of a single chip, or the image capture section and the signal processor or the optical section may be integrated together into a modular form having an image capture function.

The present invention is applicable to not only a solid-state image capture device but also an image capture apparatus. An image capture apparatus to which the present invention is applied has an advantage of an enhanced image quality. The term "image capture apparatus" as used herein refers to, for example, a camera or an image-capture-function-equipped portable device. The term "image capture" includes not only image pickup during typical camera photography but also, in a broad sense, fingerprint detection and so on.

The present application contains subject matter related to that disclosed in Japanese Priority Patent Application JP 2008-296511 filed in the Japan Patent Office on Nov. 20, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image capture device, comprising:
photoelectric conversion elements configured to photoelectrically convert incident light into signal charges;
color filter portions provided at each light incident side of the photoelectric conversion elements;
a first photoelectric conversion layer,
wherein, the first photoelectric conversion layer is an organic photoelectric conversion layer provided at each light incident side of the color filter portions, and
wherein, the organic photoelectric conversion layer contains a pigment that absorbs near infrared light; and
a second photoelectric conversion layer,
wherein, the second photoelectric conversion layer is between the color filter portions and the first photoelectric conversion layer to absorb infrared light having a longer wavelength than the near infrared light absorbed by the first photoelectric layer.

2. The solid-state image capture device according to claim 1, wherein the color filter portions have a color filter portion that is absorptive of red light, a color filter portion that is absorptive of blue light, and a color filter portion that is absorptive of green light.

3. The solid-state image capture device according to claim 1, wherein, the first photoelectric conversion layer is operable to output a near infrared-light signal; and
wherein the second photoelectric conversion layer is operable to output an infrared-light signal.

4. The solid state image capture device according to claim 1, wherein the pigment includes at least one of quinoid-based metal complex pigment, cyanine-based pigment, immonium-based pigment, diimmonium-based pigment, triarylmethane-based pigment, naphthoquinone-based pigment, anthraquinone-based pigment, squarylium-based pigment, phthalocyanine-based pigment, naphthalocyanine-based pigment, anthraquinone-based pigment, and nickel-dithiol-complex-based pigment.

* * * * *